United States Patent [19]

Tsuta

[11] Patent Number: 5,621,313
[45] Date of Patent: Apr. 15, 1997

[54] WAFER PROBING SYSTEM AND METHOD THAT STORES REFERENCE PATTERN AND MOVEMENT VALUE DATA FOR DIFFERENT KINDS OF WAFERS

[75] Inventor: Kiyoaki Tsuta, Mitaka, Japan

[73] Assignee: Tokyo Seimitsu Co., Ltd., Tokyo, Japan

[21] Appl. No.: 535,934

[22] Filed: Sep. 28, 1995

Related U.S. Application Data

[63] Continuation-in-part of Ser. No. 118,197, Sep. 9, 1993, abandoned.

[51] Int. Cl.$^6$ .................................................. G01R 1/04
[52] U.S. Cl. .................................... 324/158.1; 324/758
[58] Field of Search .............................. 324/158.1, 73.1, 324/760, 758, 754, 765; 356/400, 401; 248/201; 348/95, 87

[56] References Cited

U.S. PATENT DOCUMENTS

| | | | |
|---|---|---|---|
| 4,677,474 | 6/1987 | Sato et al. ............................... | 324/758 |
| 4,929,893 | 5/1990 | Sato et al. ............................... | 324/758 |
| 4,934,064 | 6/1990 | Yamaguchi et al. ..................... | 324/758 |
| 5,254,939 | 10/1993 | Anderson et al. ....................... | 324/754 |
| 5,410,259 | 4/1995 | Fujhara et al. .......................... | 324/758 |

FOREIGN PATENT DOCUMENTS

| | | |
|---|---|---|
| 58-196029 | 11/1983 | Japan . |
| 63-122227 | 5/1988 | Japan . |
| 3-38833 | 4/1991 | Japan . |

*Primary Examiner*—Vinh P. Nguyen
*Attorney, Agent, or Firm*—Oliff & Berridge

[57] ABSTRACT

A method for aligning a wafer probing system includes securing a wafer to a movable table; moving the table a predetermined reference position below an image sensing device for sensing a wafer circuit pattern of the wafer; transmitting the sensed wafer circuit pattern to an alignment adjustment device; bringing the table to a correlated reference position; moving the table to a first movement amount below a probing device; comparing the first movement amount to a first stored movement amount data; and moving the table a second stored movement amount such that at least one electrode pad of the wafer contacts a probe of the probing device, wherein the second stored movement amount is determined by comparison of the first movement value with the first stored movement amount data.

11 Claims, 7 Drawing Sheets

PRIOR ART

5,621,313

WAFER PROBING SYSTEM AND METHOD THAT STORES REFERENCE PATTERN AND MOVEMENT VALUE DATA FOR DIFFERENT KINDS OF WAFERS

This is a continuation-in-part of patent application Ser. No. 08/118,197 filed Sep. 9, 1993, abandoned.

BACKGROUND OF THE INVENTION

1. Field of the Invention

This invention relates to a wafer probing system, more particularly it relates to a wafer probing system for probing electric characteristics of circuit patterns formed on a semiconductor wafer.

2. Description of the Related Art

As for a semiconductor wafer, a multiplicity of same circuit patterns are formed according to the kind of the wafer. Each circuit pattern is judged whether it is good or bad by the probe card of the wafer probing system for probing the electric characteristics of each circuit pattern before the wafer is separated into individual dies.

In the wafer probing system, when the same kind wafers are probed, an alignment is performed in the first wafer and the electrode pad of the second and after wafer circuits are touched to the probe needle of the probe card certainly based on the result of the alignment.

That is, in the alignment method, as shown in FIG. 2, the first wafer 3 is held by a table 2 which is placed on the main body 1 of a wafer probing system movably and the table 2 is moved to a predetermined position under a CCD camera 4.

Next, a reference pattern among the plural alignment patterns formed on the wafer 3, which becomes a standard, is picked up with the CCD camera 4, and then the reference pattern is memorized as a model data in a RAM 5a of an image processing device 5.

Then, the table 2 is moved in the direction of a probe card 6, probe needles 7 of the probe card 6 are touched to an electrode pads of the circuit patterns on the wafer 3 and a movement value L to the touched (probed) position is memorized in a RAM 8a of a prober control part 8. And, in the first wafer 3, each circuit pattern is probed based on the position in which the electrode pads touch the probe needles 7.

As for the second and after wafers 3, first, the table 2 is moved by using a known correlation method and the like so as to pick up the same circuit pattern as the reference pattern of the model data memorized in the RAM 5a with the CCD camera 4. Next, the table 2 is moved by the movement value L memorized in the RAM 8a. Therefore, the second and after wafers 3 are moved to the position where the electrode pads touch the probe needles 7. With this arrangement, the second and after wafers 3 are aligned based on the model data and the movement value memorized concerning the first wafer 3.

However, in the alignment method in the conventional wafer probing system, for instance, when a wafer of A kind is probed and then a wafer of B kind is probed, the reference pattern and the movement value to the probed position of the A kind are deleted from the RAM 5a and 8a, therefore, when the wafer of A kind is probed again, a new reference pattern and a new movement value to the probed position must be obtained. Thus, there is a disadvantage in that the wafer can not be probed efficiently.

SUMMARY OF THE INVENTION

This invention has been developed and aims to provide a wafer probing system in which it is not needed to obtain a new reference pattern and a new movement value though the kind of the wafer is changed.

To achieve the above-described aim, according to this invention, a wafer probing system comprising: an image sensing means for performing the image sensing of a circuit pattern on a wafer; an alignment adjusting part for automatically aligning a wafer at a predetermined position on the basis of a pre-memorized reference pattern of the wafer image-sensed by the image sensing means, and for moving the aligned wafer by a movement value to a pre-memorized position of probe; an probing part having a probe card, for probing respective circuit elements of the wafer after the alignment by said probe card; characterized in that: said wafer probing system further comprises: a memory means capable of holding memory contents without any backup; and a command means for commanding to write into said memory means and read out therefrom said reference pattern and said movement value to the position of probe for every kind of wafers; whereby the reference pattern and the movement value to the position of probe corresponding to the wafer are read out from said memory means in accordance with the kinds of wafers, and thus the read out reference pattern and movement value to the position of probe are used in said alignment adjusting part.

According to this invention, the wafer probing system is provided with a memory means capable of holding memory contents without any backup and a command means for commanding to write into the memory means and read out therefrom the reference pattern and the movement value to the position of probe for every kind wafers, and then, the reference pattern and the movement value to the position of probe corresponding to the wafer are read out from the memory means and used in the alignment adjustment part of the wafer probing system.

As a result, the reference pattern of the wafer and the movement value to the probed position need not to be obtained newly though the kind of the wafer is changed. Therefore, the wafer can be efficiently probed.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENT

Detail description will hereunder be given of the preferred embodiment of a wafer probing system according to the present invention with reference to the accompanying drawings.

Figure 1:
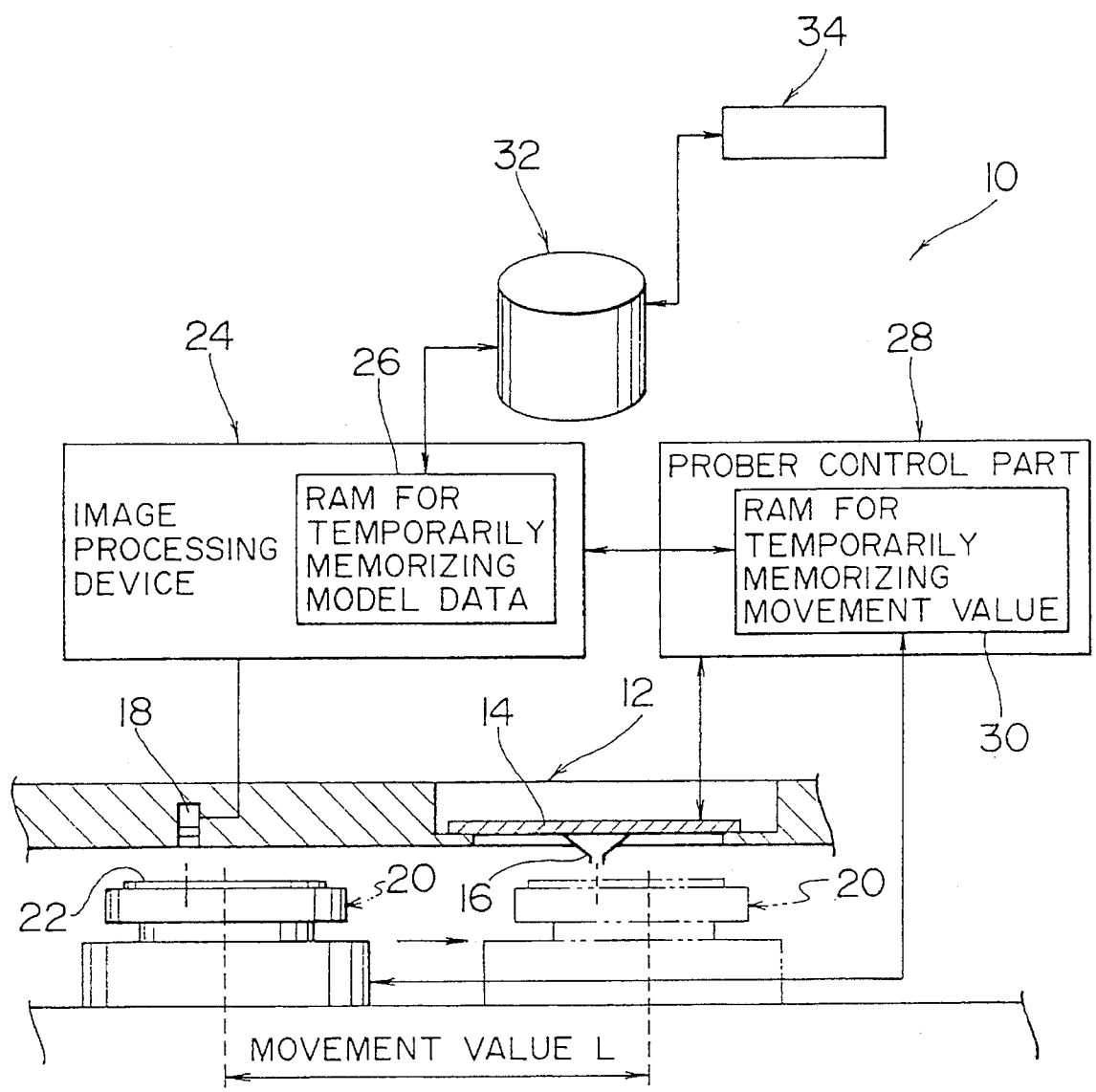
FIG. 1 is an explanatory view showing an embodiment of a wafer probing system according to this invention.
Figure 2:
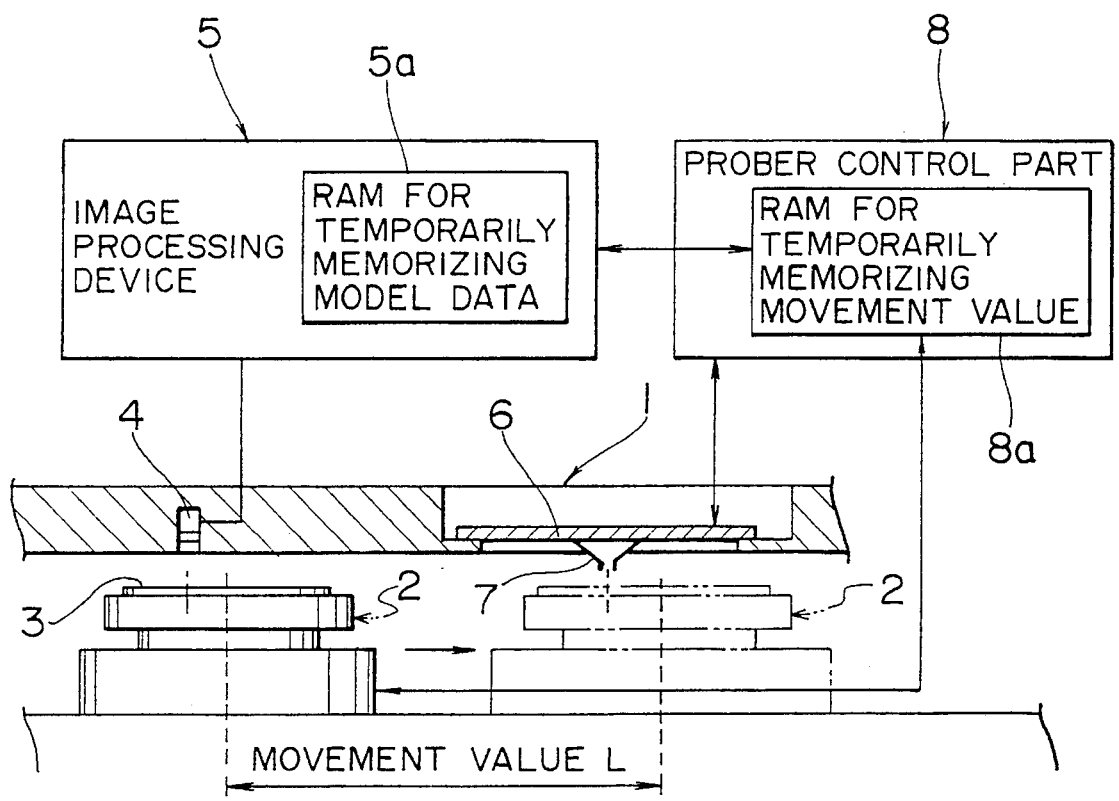
FIG. 2 is an explanatory view showing an embodiment of the conventional wafer probing system.

An embodiment of a wafer probing system 10 according to this invention is shown in FIG. 1. A probe card 14 is located in a head stage 12 of the wafer probing system 10 and plural probe needles 16, 16 . . . as measuring probers are fixed to the probe card 14. Moreover, a CCD camera 18 is set up at a predetermined position to the probe card 14 in the head stage 12. Further, a moving table 20 is arranged under the head stage 12 and a wafer 22 to be probed is held on the table 20.

On the other hand, a image processing device 24 is connected with the CCD camera 18. In the image processing device 24, the predetermined circuit pattern in the wafer 22 picked up by the CCD camera 18 (a specific pattern containing plural circuit elements and streets and a pattern aligned easily) is image-processed to obtain the model data, and the table 20 can be moved by using the known correlation method and the like so that the model data may correspond to the reference data memorized in RAM 26 temporarily. Incidentally, the reference data is described later.

Moreover, a prober control part 28 is connected to the image processing device 24. The prober control part 28 has a RAM 30, and the table 20 can be moved in the direction of the probe card 14 based on data of the movement value to the probe position of the table 20 memorized temporarily in the RAM 30. The table 20 is moved based on data of the movement value, whereby the probe needles 16, 16 . . . of the probe card 14 are touched to the electrode pad of the wafer 22. Incidentally, the data of the movement value is described later.

A hard disk device 32 is connected with the image processing device 24 and the prober control part 28, and is arranged in the wafer probing system 10.

The hard disk device 32 is provided with a memory means capable of holding memory contents without any backup and a command means for commanding to write into the memory means and read out therefrom the reference data and data of the movement value to the position of the probe for every kind of wafers. Moreover, the hard disk device 32 reads out the reference data and the data of the movement value to the position of the probe corresponding to the wafer from the memory means according to the kind of the wafer to be probed selected by the keyboard 34, and then the read out reference data and the data of the movement value to the position of the probe can be written into the respective RAMs 26 and 30 of the image processing device 24 and the prober control part 28.

Next, the explanation will be given of the alignment method of the wafer 22 with the wafer probing system 10 constructed like the above-mentioned.

First, the kind of the wafer 22 to be probed is selected with the keyboard 34 before the probe begins. Then, the reference data and the data of the movement value to the position of the probe corresponding to the wafer 22 from the memory means are read out, and the read out reference data and the data of the movement value are written into the respective RAMs 26 and 30.

Next, the probe card, which adapts to the wafer 22 to be probed, is set up. The probe card is attached by a mechanism explained in Japan Utility Model Publication No. 3-38833 and the like in which an attachment position is reproduced accurately.

Then, the wafer 22 is held by the table 20 and the table 20 is moved to a predetermined position under the CCD camera 18.

Further, the circuit pattern of the wafer 22 picked up by the CCD camera 18 (pattern containing plural circuit elements and streets) is image-processed by the image processing device 24 so as to get model data one by one. And, the table 20 is moved to the position at which the model data corresponds Go the reference data written in the RAM 26 by the known correlation method and the like.

Next, the table 20 is moved from the corresponding position by the movement value L based on data of the movement value to the probe position written in the RAM 30 of the prober control part 28. As a result, the wafer 22 is moved to the position where the electrode pad is touched to the prober needles 16, 16 . . . And, the table 20 is moved based on the touching position according to the element circuit size of the wafer 22 one by one and each element circuit of the wafer 22 is probed.

When another kind of the wafer is probed, the kind of the wafer is selected with the keyboard 34, whereby the reference data and the data of the movement value corresponding to the wafer are read out and the read out reference data and the data of the movement value are written in the respective RAMs 26 and 30. (At the time, the reference data and the data of the movement value of the wafer 22 memorized in the RAMs 26 and 30 are deleted.)

Therefore, the wafer can be probed without obtaining the reference data and the data of the movement value to the probe position.

Moreover, when the same kind of the wafer 22 is probed after probing the first wafer, the reference data and the data of the movement value to the probe position of the wafer 22 only have to be written in the respective RAMs 26 and 30.

According to this embodiment, the position of the probe card changed according as the kind of the wafer changes is reproduced accurately, therefore, the wafer can be probed efficiently in comparison with the conventional wafer probing system in which the reference data and the data of the movement value to the probe position must be obtained whenever a different kind of wafer is probed.

Incidentally, the CCD camera 18 is used as an image pickup means in this embodiment, however, this invention should not necessarily be limited to this, a microscope or another solid image pickup element may be used.

Moreover, the hard disk device 32 is used in this embodiment, however, this invention should not necessarily be limited to this, a floppy disk device or a PROM (programmable ROM) capable of rewriting many times may be used.

As has been described hereinbefore, in the wafer probing system according to this invention, a memory means capable of holding memory contents without any backup and a command means for commanding to write into and read out the reference pattern and the movement value to the position of probe for every kind of wafers are arranged, and then the reference pattern and the movement value to the position of probe corresponding to the wafer are read out based on the kinds of the wafer to be probed and the read out reference pattern and movement value to the position of probe are used in the alignment adjustment part in the wafer probing system. Therefore, the reference pattern and the movement value to the position of probe need not to be obtained newly though the kind of the wafer is changed, whereby the wafer can be efficiently probed.

Figure 3:
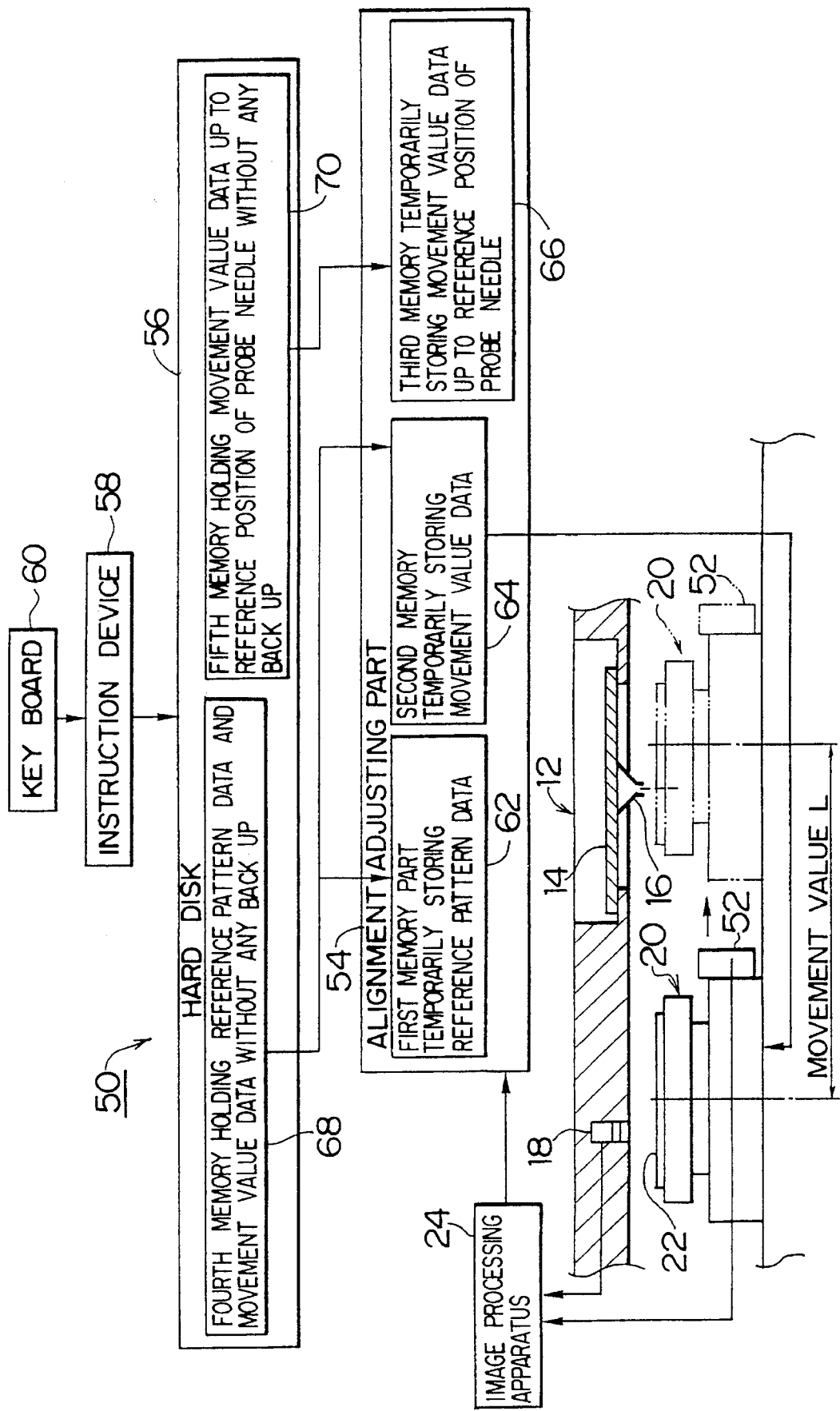
FIG. 3 is an explanatory view explaining another embodiment of the wafer probing system according to the present invention.
Figure 4:
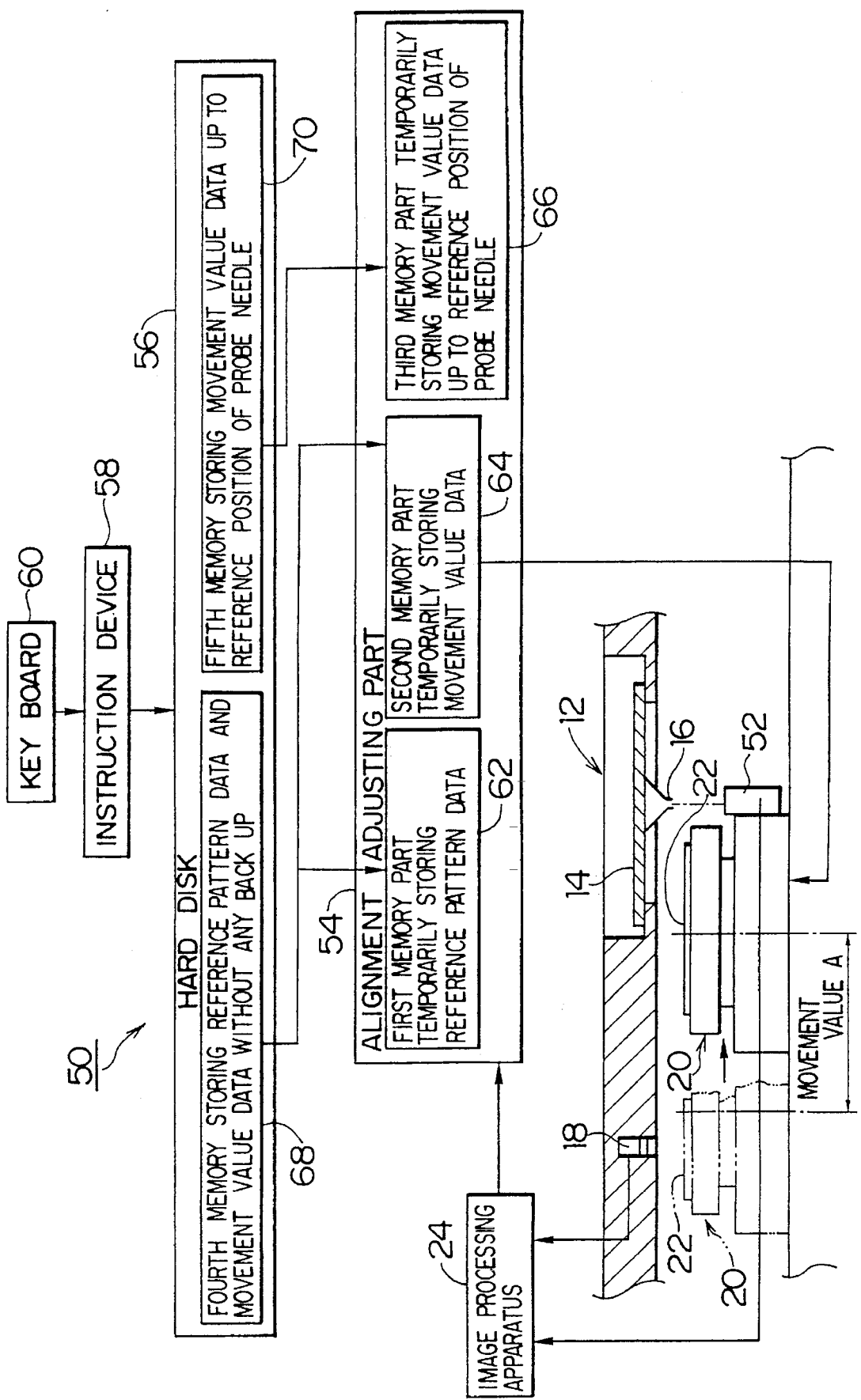
FIG. 4 is an explanatory view which illustrates a wafer probing system of a reference position of a wafer as determined by a CCD camera of a moving table according to an embodiment of the invention.

FIG. 3 illustrates another embodiment of the wafer probing system 50 according to the present invention. The same marks are put on members which are the same or similar to those of the first embodiment as shown in FIG. 1.

In a wafer probing system 50 shown in FIG. 3, a CCD camera 52 same is attached at the right side of the moving table 20. The CCD camera 52 picks up the probe needles 16 at a predetermined position while the moving table 20 moves toward the probe card 14. An output signal indicating the probe needles 16, which were picked up by the CCD camera 52, is transduced into a video signal by the image processing device 24 and is sent to an alignment adjusting part 54.

The wafer probing system 50 has the alignment adjusting part 54, a hard disk 56, an instruction device 58 and a key board 60.

A first temporary memory device (RAM) 62, a second temporary memory device (RAM) 64 and a third temporary memory device (RAM) 66 are built into the alignment adjusting part 54. Reference pattern data of the wafer 22 is temporarily memorized in a first memory part 62. Movement value data (L) relating to movement of the moving table 20 up to the probe card 14 is temporarily memorized in the second memory part 64. Movement value data (A) relating to movement of the moving table 20 up to a reference position of the probe needles 16 is temporarily memorized in the third memory 66.

A fourth memory part 68 and a fifth memory part 70 are built into the hard disk 56. Reference pattern data of each wafer and movement value data (L) of the moving table 20, which corresponds to each wafer, are registered in the fourth memory 68 without any back up. The movement value data (A) concerning the movement of the moving table 20 up to a reference position of a probe needle of each probe card is registered in the fifth memory 70 without any back up.

The instruction device 58 is made to work by an input operation of the key board 60. That is, the instruction device 58 receives the type of wafer 22 inputted via the keyboard 22, and reads out the reference pattern data which corresponds to the type of wafer 22 and the movement value data (L) from the fourth memory part 68 of the hard disk 56. Then, the instruction device 58 makes the first memory 62 of the alignment adjustment 54 memorize the readout reference pattern data, and makes the second memory 64 of the alignment adjusting part 54 memorize the readout movement value data (L). Moreover, when the type of wafer 22 is inputted via the keyboard 60 to the instruction device 58, it reads out the movement value data (A) concerning the movement of the moving table 20 up to a reference position of the probe needles 16 of the probe card 14, which corresponds to the type of wafer 22, from a fifth memory 70 of the hard disk 56, and stores the readout movement value data (A) in a third memory 66 of the alignment adjusting part 54.

Figure 5:
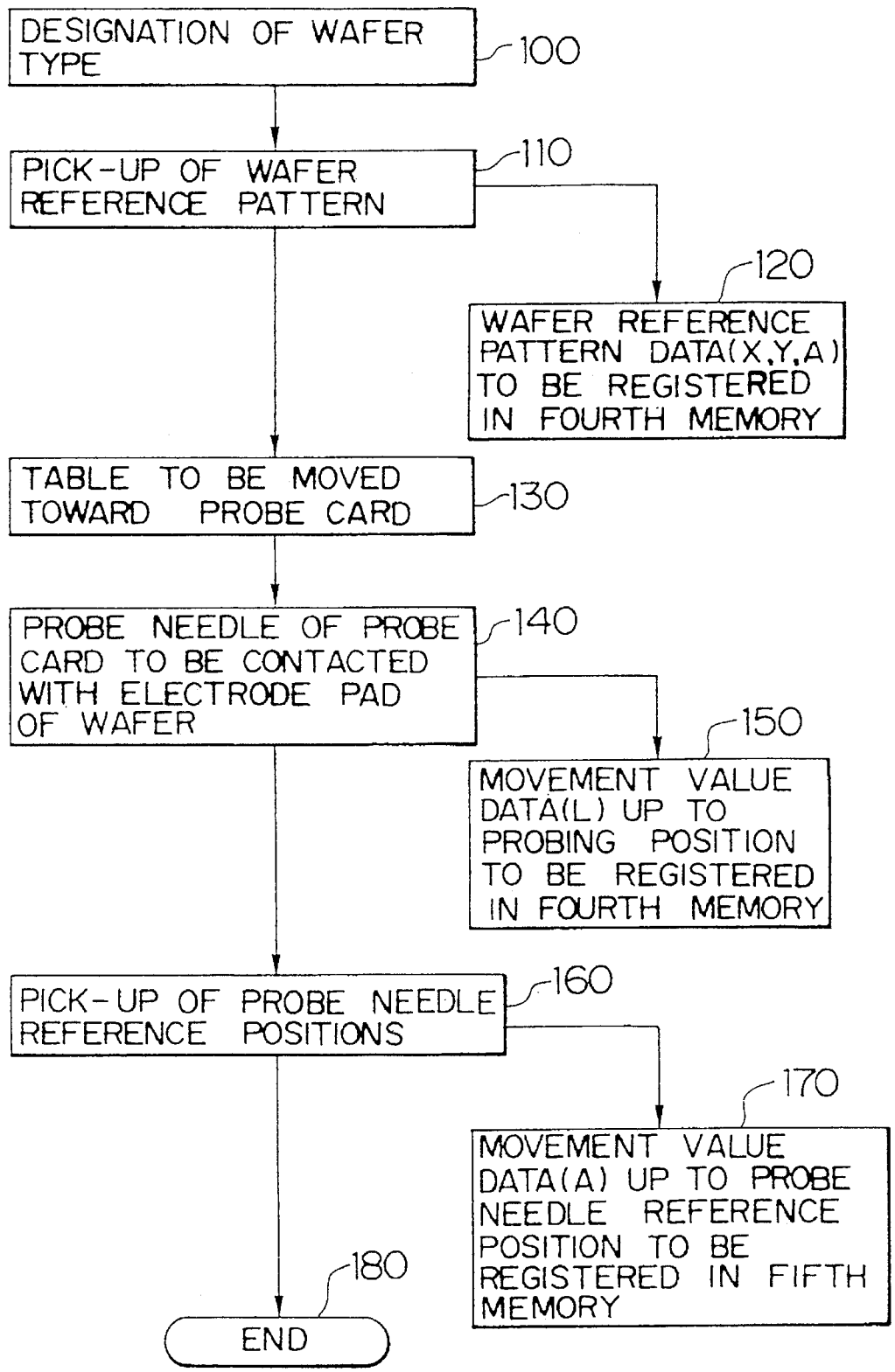
FIG. 5 is a flow chart illustrating a procedure for initializing a wafer according to an embodiment of the invention.

Next, an explanation will be given of a procedure for registering movement value data (L) of the moving table 20 which corresponds to a type of wafer and movement value data (A) as to the movement of the moving table 20 up to a reference position of the probe needle of each probe card with reference to FIG. 5.

First, an electrode pad of a type of wafer (for example, type A) is contacted with the probe needles 16 (Step 140). Then, the movement value of the moving table 20 from a position where the CCD camera 18 picks up the reference pattern up to a position where the electrode pad contacts the probe needles 16, is registered as movement value data (L) in the fourth memory 68 of the hard disk 56 (Step 150).

The moving table 20 is moved to a position where the CCD camera 52 can pick up the probe needles 16, so that the CCD camera 52 picks up reference positions of the probe needles 16 (Step 160). Then, a movement value of the moving table 20 from a position where the CCD camera 18 picks up the reference pattern up to a position where the CCD camera 52 picks up positions of the probe needles 16 is registered as movement value data (A) in the fifth memory 70 of the hard disk 56 (Step 170). As a result, the registration of the type A wafer is completed (Step 180).

As described above, the registration is carried out for wafers of type B, type C etc. As a result, the reference pattern data and the movement value data (A) of many wafers are registered in the fourth memory 68 of the hard disk 56, and the movement value data (A) which corresponds to many probe cards is registered in the fifth memory 70.

Next, an explanation will be given of a method of aligning the wafer by the wafer probing system which is constructed in the above-mentioned manner with reference to the flow charts in FIGS. 6 and 7.

Figure 6:
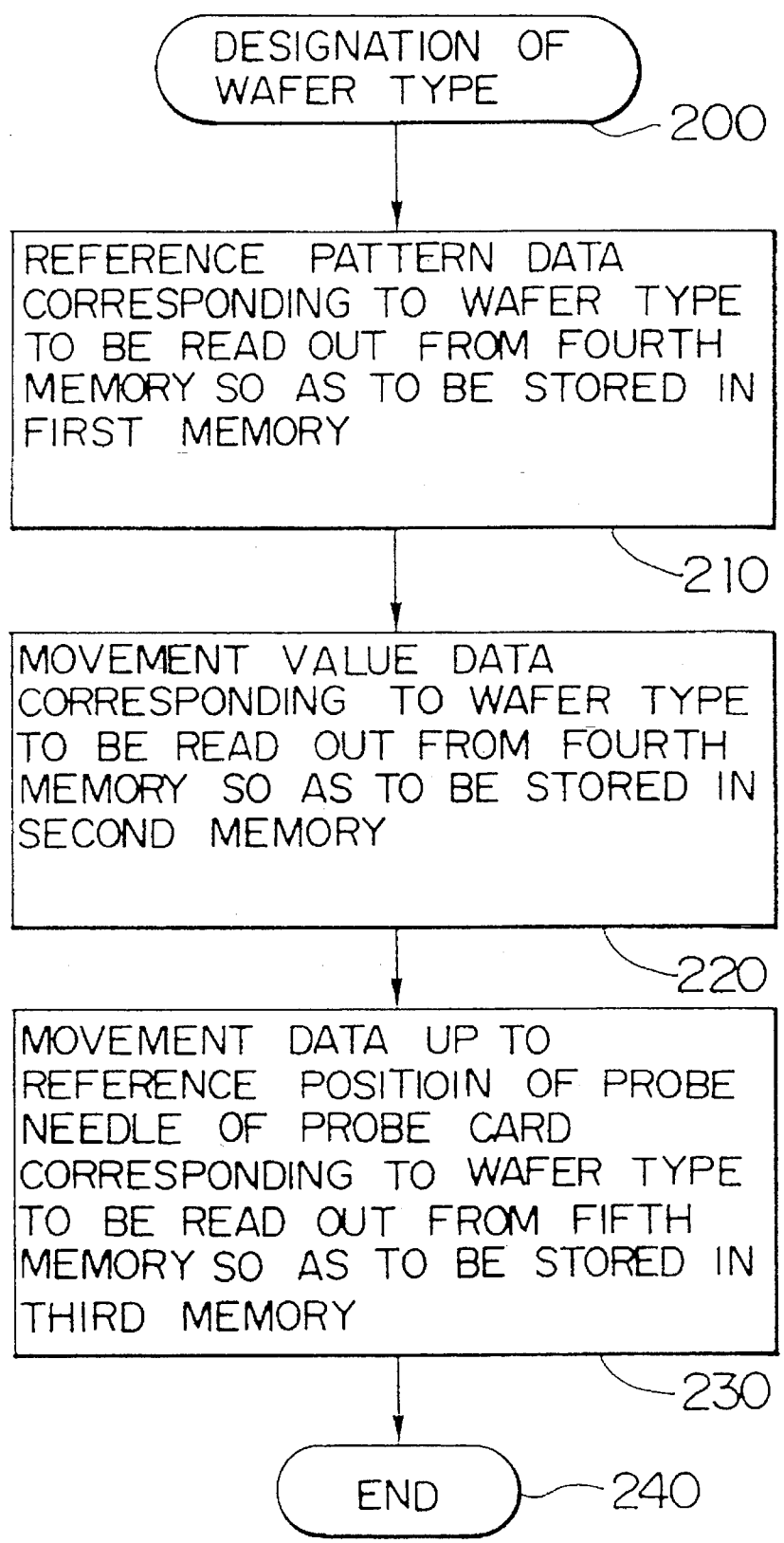
FIG. 6 is a flow chart illustrating a procedure for storing initialized data in memory according to an embodiment of the invention.

First, in FIG. 6, before probing is started, the type of wafer to be probed is inputted to the instruction device 58 via the key board 60 (refer to FIG. 3) (Step 200). As a result, the instruction device 58 reads out the reference data corresponding to the wafer 22 and the movement value data (L) as to the movement up to a probing position from the fourth memory 68 of the hard disk 56. Then, the instruction device 58 stores the readout reference data in the first memory 62 of the alignment adjusting part 54 (Step 210), and stores the readout movement value data (L) in the second memory 64 of the alignment adjusting part 54 (Step 220). Next, the instruction device 58 reads out the movement value data (A) as to the movement of the moving table 20 up to the reference position of the probe needles 16, of the probe card 14 corresponding to the wafer 22 from the fifth memory part 68 of the hard disk 56. Then, it stores the readout movement value data (A) in the third memory 66 of the alignment adjusting part 54 (Step 230). As a result, preparation for the alignment of the wafer 22 is completed (Step 240).

Figure 7:
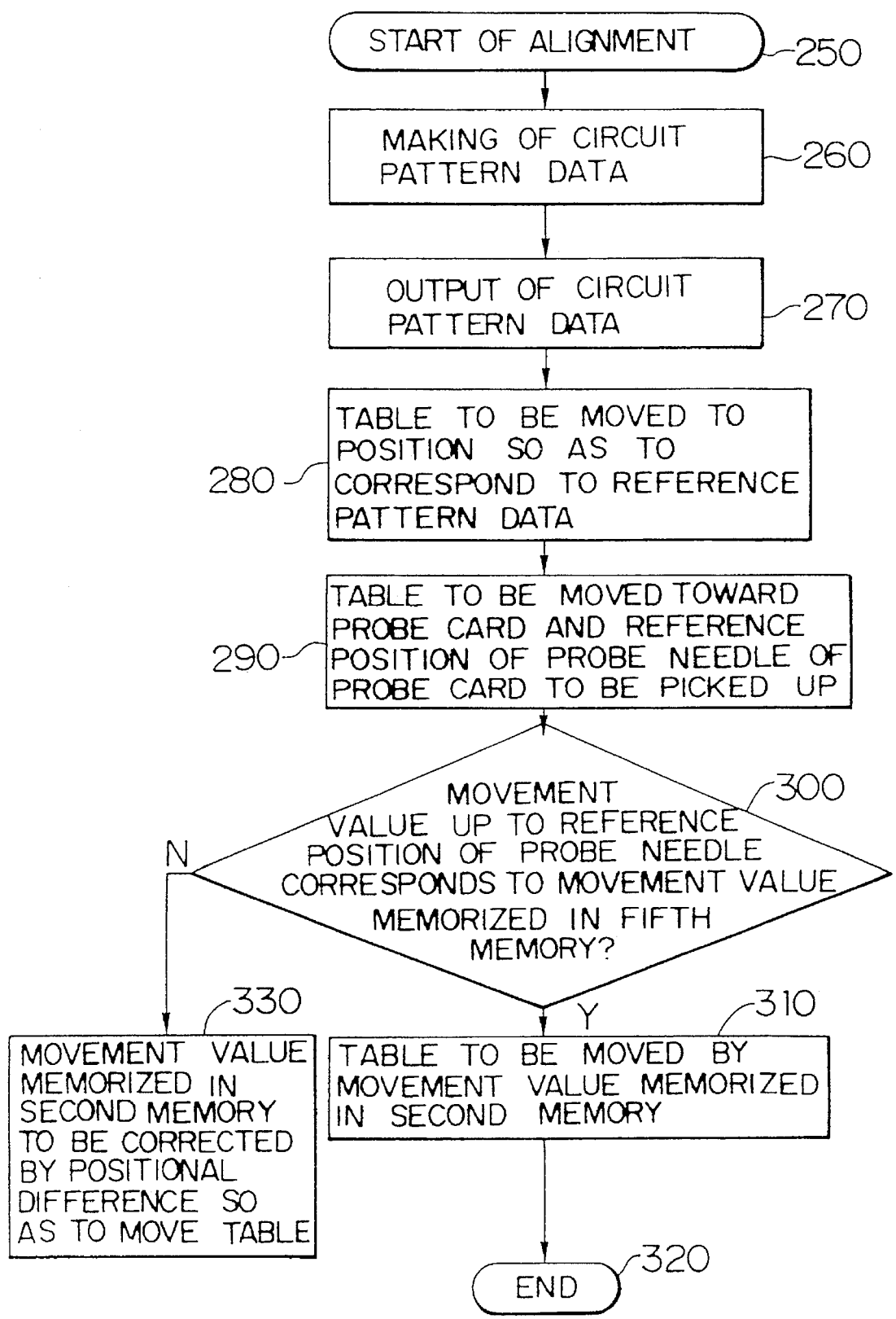
FIG. 7 is a flow chart illustrating a procedure for aligning a wafer according to an embodiment of the invention.

Next, alignment of the wafer 22 is started in FIG. 7 (Step 250). The wafer 22 is absorbed to the table 20, and the table 20 is moved to a predetermined reference position below the CCD camera 18 (refer to FIG. 3).

Next, a circuit pattern of the wafer 22 picked up by the CCD camera 18 is image-processed by the image processing device 24, so that circuit pattern data is sequentially made (Step 260). Then, the circuit pattern data is outputted to the alignment adjustment part 54 (Step 270). The moving table 20 is moved up to a correlated reference position where the circuit pattern data corresponds to the reference pattern data stored in the first memory part 62 and thereafter electrically retrieved for use by means of a well-known correlation method, etc. (Step 280).

Next, the moving table 20 is moved towards and below the probe card 14. Reference positions of the probe needles 16 of the probe card 14 are picked up by the CCD camera 52 while the moving table 20 is being moved (Step 290). Then, first movement amount or value data (A') as to a movement of the moving table 20 up to the reference positions of the probe needles 16 is compared with first stored movement value data (A), which is memorized as a reference in the third memory part 66 of the alignment adjusting part 54 (Step 300) and electrically retrieved for use.

In the case that the first movement amount or value data (A') is equal to the first stored movement value data (A), that is, in the case that the reference position of the probe needle at the time of registering the movement value data (A) corresponds to the reference position of the probe needles 16 at the time of alignment, the moving table 20 is moved by a second, stored movement amount or value (L) memorized in the second memory 64 of the alignment adjusting part 54 and electrically retrieved for use (Step 310). As a result, the wafer 22 is moved up to a position where the electrode pad contacts the probe needles 16 so that the alignment of the wafer 22 is completed (Step 320).

On the other hand, in the case that the first movement amount or value data (A') is not equal to the first stored movement value data (A), that is, in the case that the reference position of the probe needles 16 at the time of alignment is different from the position of the probe needle at the time of registering the movement value data (A), the moving table 20 is moved by a different second stored movement amount calculated by subtracting or adding a difference value or amount (Step 330). As a result, even if the reference position of the probe needles 16 is different, the wafer 22 is moved up to a position where the electrode pad contacts the probe needles 16.

Accordingly, the movement value data (A) which changes in accordance with the difference of the reference position of the probe needle is corrected as well as the reference pattern data of the wafer and the movement value data (L).

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A method for aligning a wafer probing system comprising:

securing a wafer to a movable table;

moving the table to a predetermined reference position below an image sensing device for sensing a wafer circuit pattern of the wafer;

transmitting the wafer circuit pattern sensed by the image sensing device to an alignment adjustment device;

bringing the table to a correlated reference position;

moving the table a first movement amount below a probing device;

comparing the first movement amount to a first stored movement amount data; and moving the table a second stored movement amount such that at least one electrode pad of the wafer contacts a probe of the probing device, said stored, second movement amount being determined by results of the comparison of the first movement amount with the first stored movement amount data.

2. The method of claim 1, wherein the second stored movement amount is calculated by using a difference amount when said first movement amount is not equal to the first stored movement amount data.

3. The method of claim 1, further comprising:

electrically retrieving data used to determine the correlated reference position from a first temporary memory device.

4. The method of claim 1, further comprising:

electrically retrieving the second stored movement amount from a second temporary memory device.

5. The method of claim 1, further comprising:

electrically retrieving the first stored movement amount data from a third temporary memory device.

6. A wafer probing system comprising:

a movable table for moving at least one wafer;

an image sensing device for sensing a wafer circuit pattern of the at least one wafer when the table moves the wafer below the image sensing device and for transmitting the wafer circuit pattern to other parts of the system;

an alignment adjusting device for receiving the wafer circuit pattern and for aligning the at least one wafer for probing, said alignment adjustment device comprising a first temporary memory device for storing data used to determine correlated reference positions for the at least one wafer, a second temporary memory device for storing a movement amount used to align the at least one electrode pad of the at least one wafer with a probe, and a third temporary memory device for storing movement data used in aligning the at least one wafer, wherein said alignment adjustment device compares a first movement amount of said movable table moving to a reference position of said probe with a second movement amount stored in said third temporary memory device and, if said first and second compared movement amounts are equal, said table is moved by said movement amount stored in said second temporary memory device and, if said first and second compared movement amounts are not equal, said table is moved by a movement amount that is found by compensating said movement amount in said second temporary memory device by a difference between said first movement amount of said movable table moving to said reference position of said probe and said second movement amount stored in said third temporary memory device; and a probe for probing the wafer.

7. A method for aligning a wafer probing system for probing a plurality of wafers having different circuit patterns, comprising:

securing a wafer having a specific circuit pattern to a movable table;

moving the table a predetermined reference position below an image sensing device for sensing the circuit pattern of the wafer;

transmitting the circuit pattern sensed by the image sensing device to an alignment adjustment device;

bringing the table to a correlated reference position;

moving the table a first movement value below a probing device;

comparing the first movement value to a first stored movement value data for a previous wafer having the same circuit pattern; and moving the table a second stored movement amount such that at least one electrode pad of the wafer contacts a probe of the probing device, wherein the second stored movement amount is determined by comparison of the first movement value with the first stored movement value data.

8. The method for aligning a wafer probing system recited in claim 7, further comprising electrically retrieving said first stored movement value data.

9. The method for aligning a wafer probing system recited in claim 7, further comprising electrically retrieving said second stored movement amount.

10. The method for aligning a wafer probing system recited in claim 7, further comprising electrically retrieving data used to determine said correlated reference position.

11. The method for aligning a wafer probing system recited in claim 7, further comprising a plurality of temporary memory devices.

* * * * *